United States Patent
Cader et al.

(10) Patent No.: US 10,874,035 B2
(45) Date of Patent: Dec. 22, 2020

(54) IDENTIFYING COOLING LOOP CHARACTERISTICS

(71) Applicant: HEWLETT PACKARD ENTERPRISE DEVELOPMENT LP, Houston, TX (US)

(72) Inventors: Tahir Cader, Spokane, WA (US); David A. Moore, Houston, TX (US); Greg Scott Long, Corvallis, OR (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 416 days.

(21) Appl. No.: 15/772,903

(22) PCT Filed: Dec. 18, 2015

(86) PCT No.: PCT/US2015/066734
§ 371 (c)(1),
(2) Date: May 2, 2018

(87) PCT Pub. No.: WO2017/105499
PCT Pub. Date: Jun. 22, 2017

(65) Prior Publication Data
US 2018/0317347 A1 Nov. 1, 2018

(51) Int. Cl.
*H05K 7/20* (2006.01)
*G06F 1/20* (2006.01)
(Continued)

(52) U.S. Cl.
CPC ......... *H05K 7/20836* (2013.01); *G05B 15/02* (2013.01); *G05D 7/0676* (2013.01);
(Continued)

(58) Field of Classification Search
CPC .......... H05K 7/20745; H05K 7/20836; H05K 7/20827; H05K 7/2079; H05K 7/20781; G05B 15/02
See application file for complete search history.

(56) References Cited

U.S. PATENT DOCUMENTS

| | | | |
|---|---|---|---|
| 7,676,280 B1 | 3/2010 | Bash et al. | |
| 7,864,530 B1 * | 1/2011 | Hamburgen | H05K 7/2079 361/699 |

(Continued)

FOREIGN PATENT DOCUMENTS

| | | |
|---|---|---|
| CN | 104748324 A | 7/2015 |
| WO | WO-2009082401 A1 | 7/2009 |
| WO | WO-2015017737 A2 | 2/2015 |

OTHER PUBLICATIONS

International Search Report and Written Opinion received for PCT Patent Application No. PCT/US2015/066734, dated Sep. 12, 2016, 9 pages.

(Continued)

*Primary Examiner* — Ronald D Hartman, Jr.
(74) *Attorney, Agent, or Firm* — Hewlett Packard Enterprise Patent Department

(57) ABSTRACT

An example device in accordance with an aspect of the present disclosure includes a collection engine and a correlation engine to identify cooling loop characteristics. The collection engine is to collect data from devices associated with cooling loops. The correlation engine is to identify, based on the data collected, a common loop from among the cooling loops, and which of the devices are associated with the common loop.

15 Claims, 5 Drawing Sheets

(51) Int. Cl.
*G05B 15/02* (2006.01)
*G05D 7/06* (2006.01)
*G06F 30/20* (2020.01)

(52) U.S. Cl.
CPC ............ G06F 1/20 (2013.01); H05K 7/2079 (2013.01); *G06F 30/20* (2020.01)

(56) References Cited

U.S. PATENT DOCUMENTS

| | | | |
|---|---|---|---|
| 8,180,494 B2 | 5/2012 | Dawson et al. | |
| 8,346,398 B2 | 1/2013 | Ahmed et al. | |
| 8,712,735 B2 | 4/2014 | Vangilder et al. | |
| 8,713,735 B1 | 5/2014 | Pelton | |
| 2004/0240514 A1* | 12/2004 | Bash | H05K 7/20836 374/109 |
| 2006/0042289 A1 | 3/2006 | Campbell et al. | |
| 2008/0288193 A1* | 11/2008 | Claassen | H05K 7/20836 702/61 |
| 2009/0309570 A1 | 12/2009 | Lehmann et al. | |
| 2010/0236772 A1 | 9/2010 | Novotny et al. | |
| 2012/0203381 A1 | 8/2012 | Shah et al. | |
| 2013/0016472 A1 | 1/2013 | Huettner et al. | |
| 2013/0104383 A1 | 5/2013 | Campbell et al. | |
| 2013/0264044 A1* | 10/2013 | Kearney | F25B 5/02 165/200 |
| 2013/0317785 A1* | 11/2013 | Chainer | H05K 7/20836 703/1 |
| 2014/0029196 A1* | 1/2014 | Smith | H05K 7/20836 361/679.53 |
| 2014/0163767 A1 | 6/2014 | Campbell et al. | |
| 2015/0048950 A1 | 2/2015 | Zeighami et al. | |
| 2015/0153109 A1* | 6/2015 | Reytblat | H05K 7/20827 62/311 |
| 2015/0195953 A1 | 7/2015 | Best et al. | |
| 2015/0334879 A1* | 11/2015 | Fricker | H05K 7/20545 361/679.47 |
| 2016/0338230 A1* | 11/2016 | Kaplan | H05K 7/20809 |
| 2017/0231118 A1* | 8/2017 | Cader | H05K 7/20381 |
| 2018/0046232 A1* | 2/2018 | Wang | G06F 1/206 |
| 2019/0350109 A1* | 11/2019 | Marchetti | H05K 7/2079 |
| 2020/0253091 A1* | 8/2020 | Gao | H05K 7/20836 |

OTHER PUBLICATIONS

International Preliminary Report on Patentability received for PCT Patent Application No. PCT/US2015/066734, dated Jun. 28, 2018, 8 pages.
Extended European Search Report, EP Application No. 15910960.2, dated Mar. 23, 2018, pp. 1-7, EPO.
International Search Report and Written Opinion, International Application No. PCT/US2015/066734, dated Sep. 12, 2016, pp. 1-9, KIPO.

* cited by examiner

IDENTIFYING COOLING LOOP CHARACTERISTICS

BACKGROUND

Cooling systems, including liquid-based cooling systems, are increasingly used in environments such as managed data centers. The management of cooling systems may be based on an understanding of interconnections between cooling systems and the devices being cooled. For example, a liquid cooling system may involve plumbing and interconnection links between racks of many computing systems. Ascertaining the layout of cooling systems can rely on labor-intensive and tedious physical viewing of equipment, portions of which may be obscured by other equipment. Furthermore, because the arrangement of equipment in data centers can change over time, a static diagram of the layout of the equipment may quickly become outdated or misleading as equipment moves/updates are carried out over time.

BRIEF DESCRIPTION OF THE DRAWINGS/FIGURES

Figure 3:
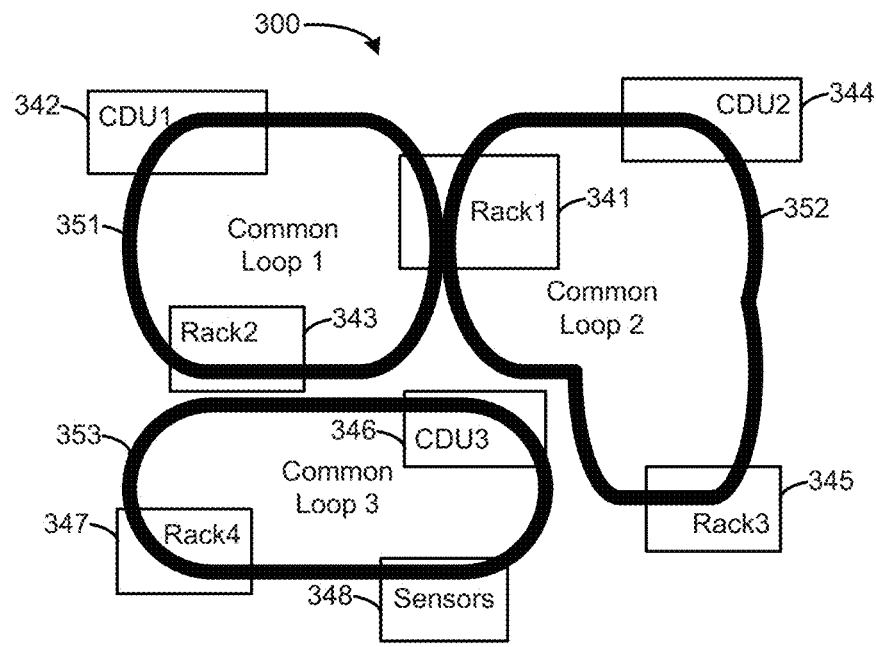

FIG. 3 is a block diagram of a system including a plurality of cooling loops, including common loop 1, common loop 2, and common loop 3 according to an example.

Figure 4:
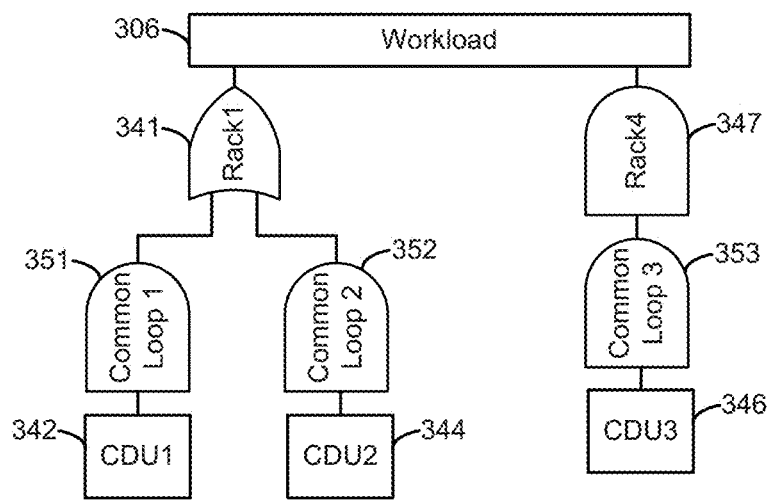

FIG. 4 is a connection diagram from the perspective of a workload, including common loop 1, common loop 2, and common loop 3 according to an example.

Figure 5:
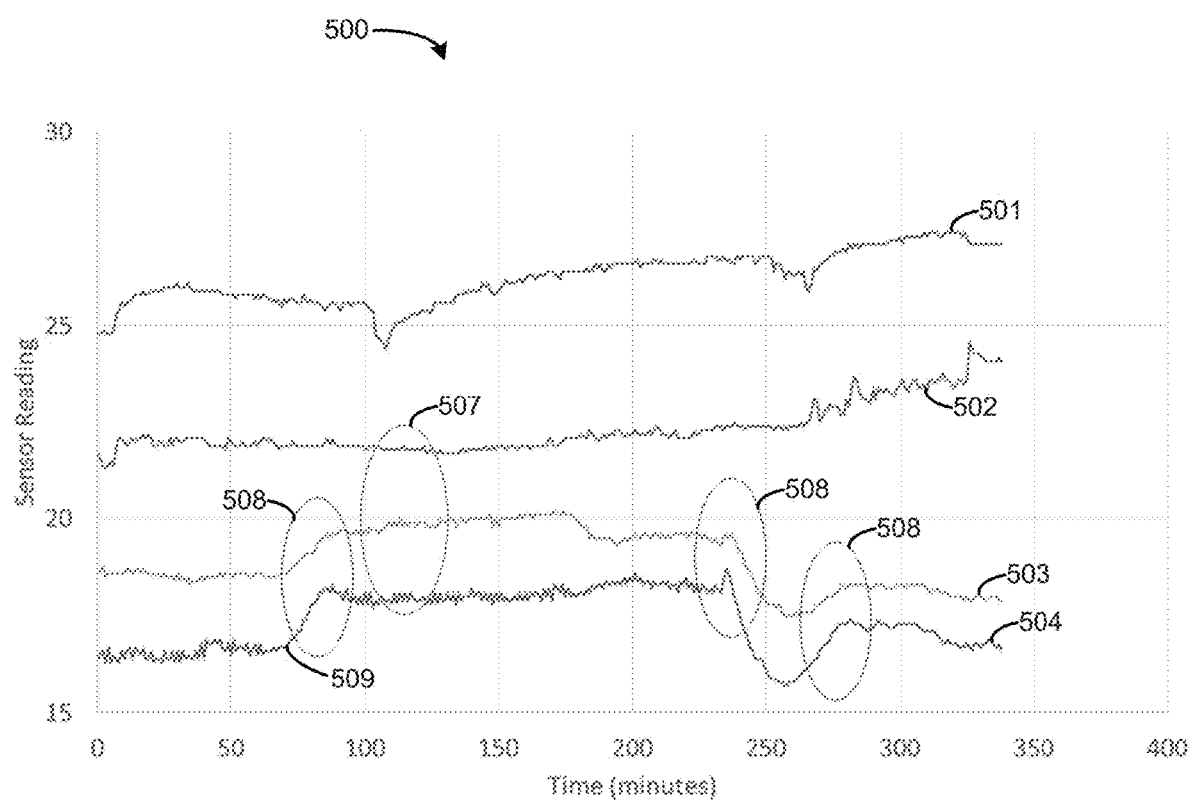

FIG. 5 is a chart showing sensor readings from a plurality of devices, including correlations, events, and trends according to an example.

Figure 6:
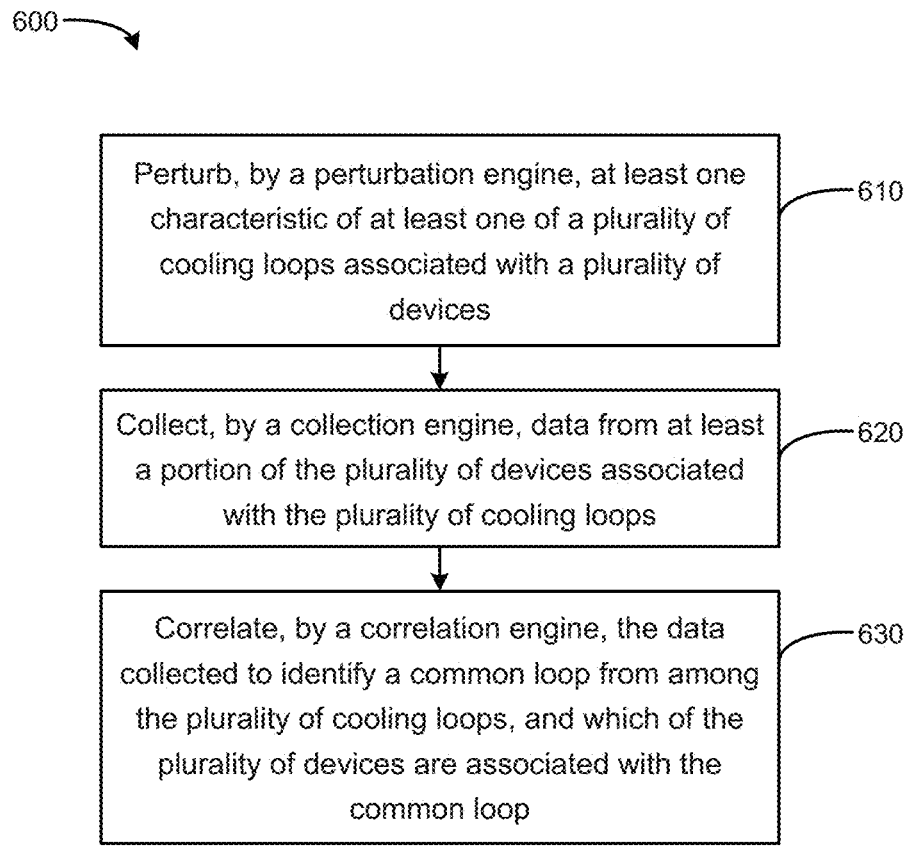

FIG. 6 is a flow chart based on identifying a common loop according to an example.

Figure 7:
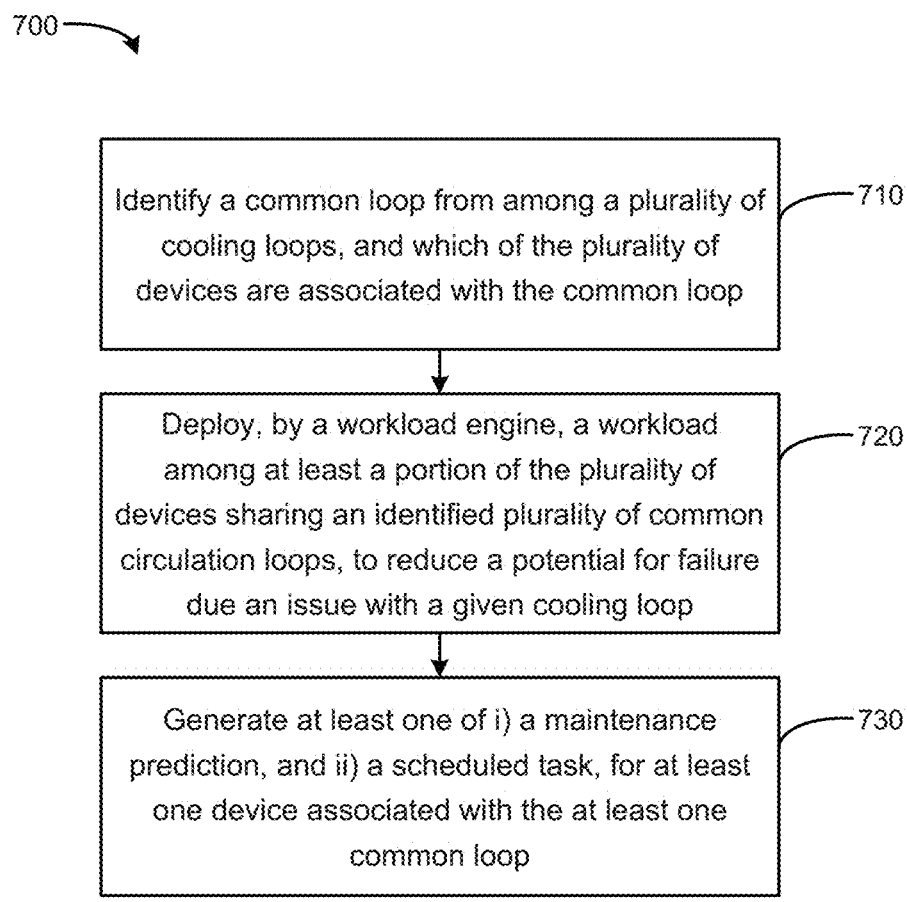

FIG. 7 is a flow chart based on deploying a workload and generating a prediction and/or task according to an example.

DETAILED DESCRIPTION

Cooling systems, such as data center liquid cooling systems, can involve complex hardware arrangements, and include dependencies of interconnected webs of plumbing and controls, such as pumps, valves, sensors, power, administrative connections, and the like. A given cooling system may include multiple cooling loops and sub-domains at a data center. It is desirable for an operator to find out how a fault or maintenance event on a given sub-system might affect other sub-system(s) and/or the overall operation of the data center. Although a graphical representation of the interdependence of sub-systems can offer some benefit to the operator, cooling loop analysis involves a tedious manual process. In some cases, this assessment process itself can result in risk to system availability, because some portions of a system may be blocked by equipment that needs to be removed to assess the entire system. Further, subsystem issues may not even be recognized and acted upon, until availability is affected and the system is analyzed in response to the system being affected (e.g. shutting down a computing system server/rack due to overheating).

To address such issues, implementations described herein may provide automated and/or real-time discovery of cooling interconnections for, e.g., data center systems or other applications using cooling loops, such as systems management of liquid cooling plumbing connections and devices that share a common circulation loop. Implementations also can provide, to data center operators, automated detection of plumbing components and connections with interactive display and programmatic availability of information that is automatically gathered from devices (e.g., computing systems, coolant distribution units, sensors, and the like) in cooling loops.

Automated detection of liquid cooling loop domain dependencies can provide different types of valuable information to data center operators. For example, automated discovery of the interdependence of cooling systems and equipment can provide a real-time set of fault-tree diagrams illustrating, e.g., dependencies, and provide an intuitive interface for operators. The data collected to provide these diagrams can also be used for other analytical purposes, such as reliability modelling, maintenance prediction, scheduling, and other administrative and analytical tasks. Furthermore, workload failure risk can be minimized by using cooling system information to aid in manual or automated workload placement into the equipment on separate cooling loops, such that an issue with a given cooling loop will not negatively affect the workload.

Figure 1:
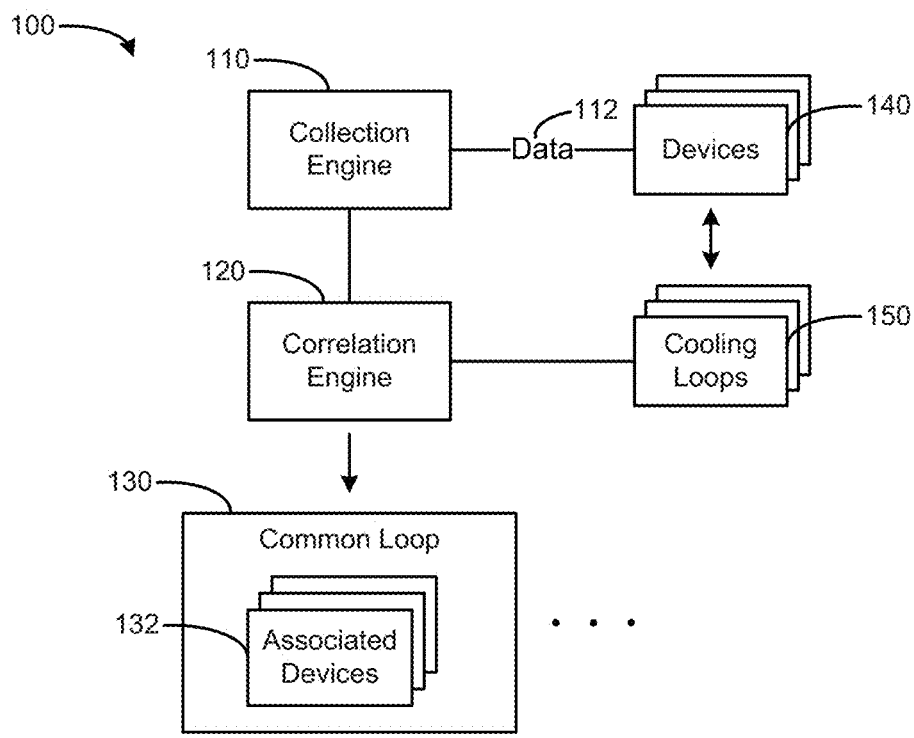
FIG. 1 is a block diagram of a system to identify cooling loop characteristics, including a collection engine and a correlation engine according to an example.

FIG. 1 is a block diagram of a system 100 to identify cooling loop characteristics, including a collection engine 110 and a correlation engine 120 according to an example. The collection engine 110 is to collect data 112 from devices 140, which are associated with at least one of the cooling loops 150. The correlation engine 120 is to identify at least one common loop 130 from among the plurality of devices 140 and cooling loops 150, and the associated devices 132 corresponding to the at least one common loop 130.

The devices 140 can include individual sensors, as well as entire computing systems and/or equipment having multiple sensors and other features (e.g., features that can collect data/characteristics from the cooling loops 150, as well as features that can influence/alter/perturb characteristics of the cooling loops 150). Thus, data 112 can be obtained from, and/or sent to, the devices 140. The devices 140 are in communication with at least one cooling loop 150, and can be positioned in multiple locations on a cooling loop 150. A device 140 need not be in direct contact with the coolant (fluid, gas, or other media circulated in a cooling loop) of a cooling loop 150, and may be used to gather data 112 without directly contacting the coolant (e.g., a temperature sensor device 140 may gather temperature indirectly through a wall of a pipe without the sensor needing to be immersed in liquid coolant). Devices 140 based on sensors can include temperature sensors, pressure sensors, flow sensors, chemical sensors, and the like. Devices 140 based on systems and/or equipment can include computing systems/servers, coolant distribution units (CDUs), valves, pumps, and the like. The collection engine 110 is in communication with the devices 140 to collect characteristics/information/data 112, to be used by the correlation engine 120 to form inferences about which of the devices 140 are associated devices 132 corresponding to a given common loop(s) 130. The correlation engine 120 also can infer in what order the associated devices 132 are connected to the common loop 130 and/or to each other. The collection engine 110, in addition to collecting data 112, can be used to instruct a device 140 to perturb itself, thereby affecting at least one characteristic of a cooling loop 150. For example, the collection engine 110 can instruct a pump device 140 to increase its pumping rate, thereby increasing the flow of coolant in its associated cooling loop 150, causing flow sensor devices 140 corresponding to that common loop 130 to reflect that increased coolant flow. In other implementations, workload assignments can be used to perturb the temperature characteristics, based on assigning more or less of the workload to a given processor to increase or decrease the temperature. Thus, workload assignment and processor activity can represent a device to vary a temperature characteristic of a cooling loop(s) associated with that processor device.

Figure 2:
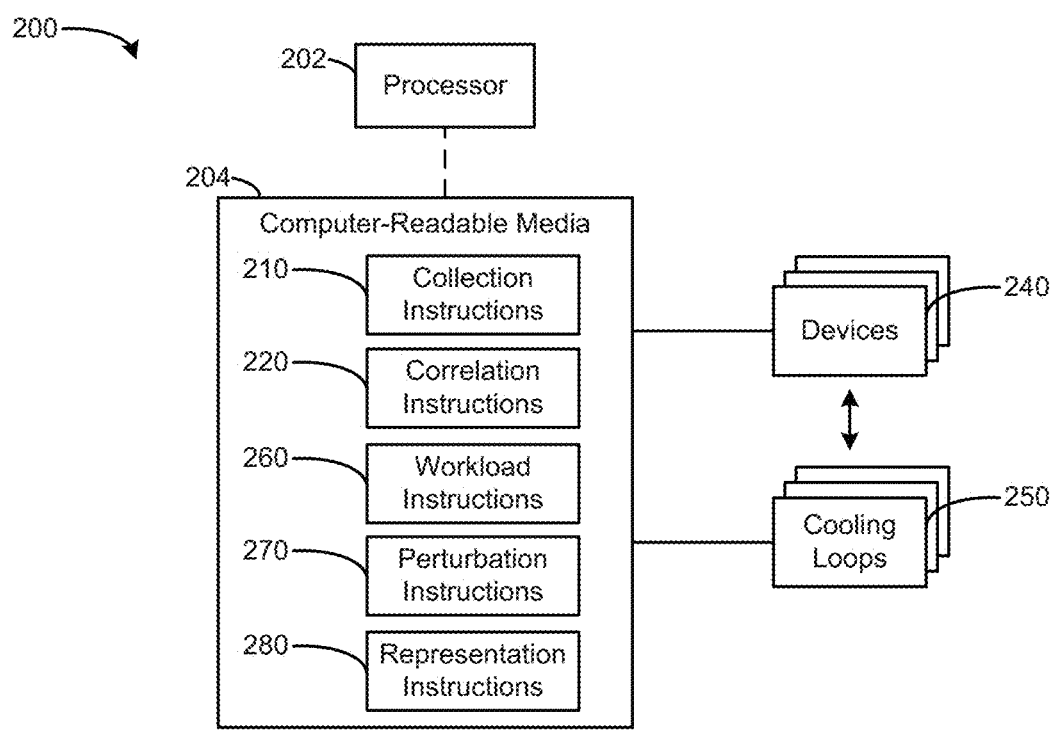
FIG. 2 is a block diagram of a system to identify cooling loop characteristics, including collection instructions, correlation instructions, workload instructions, perturbation instructions, and representation instructions according to an example.

In some alternate examples, a system can perturb characteristics using a perturbation engine (not shown in FIG. 1; corresponding to an engine running perturbation instructions 270 shown in FIG. 2). The perturbation engine can instruct a device to perturb itself. Additional engines may be used to perform various functions, such as a workload engine (corresponding to workload instructions 260 of FIG. 2) to deploy workloads, and a representation engine (corresponding to representation instructions 280 of FIG. 2) to provide a connection diagram, although such engines are not specifically illustrated in FIG. 1.

In an example implementation involving computing system devices and CDUs arranged in a plurality of racks, a data center may include a set of five racks interconnected via at least one cooling loop. One of the five racks can include a CDU device to provide cooling to the other four computing system device racks. The data center can include multiples of this five-rack arrangement, connected via a similar networking setup. Thus, such a datacenter would include a plurality of five-device cooling loops. Some of those plurality of cooling loops can be fluidically interconnected, such that there is at least one common loop among the plurality of five-rack cooling loops. A collection engine can collect data from the various devices, to identify that the various devices are interconnected via cooling loops, and how the devices may or may not share a common loop.

The devices 140 serving as sensors can include a sensor to perform chemical sensing, such as a complex impedance sensor to detect impedance characteristics of a liquid coolant. In the example five-rack implementation described above, such chemical sensor devices 140 can be placed on the racks, CDU, and/or anywhere in a cooling loop path to identify chemical concentrations, or changes in chemical concentrations, as a way to infer correlations between members of associated devices 132 in a common loop 130. A chemical deployment device (e.g., cartridge-based) can be used to selectively adjust and/or perturb levels of chemicals such as biocides, corrosion inhibitors, and the like, to perturb (or restore balance to) chemical characteristics of a given cooling loop 150.

The correlation engine 120 can use general rules pertaining to hardware implementation (e.g., how a device might be fluidically coupled to another device), and the visibility into collected data 112 arising from existing configurations, to build a supply and consumption relationship among cooling loop components/devices, including and not limited to cooling distribution units (CDUs) and connected computing system racks. The correlation engine 120 can discover and identify any changing nature of fault relationships, e.g., based on periodic or event-driven discovery and analysis of configuration changes and operational statuses.

The correlation engine 120 can directly read and/or infer substantial information about component/device connections and inter-dependencies. The correlation engine 120 can obtain such information from the collection engine 110, which can collect such data 112 from system management hardware, operating systems (OSes), work schedulers, and other automated or manual sources of data 112. Collecting and analyzing such information/data 112 from these systems enables the correlation engine 120 to build a database of connections, linkages and dependencies, to identify one or more common loops 130 and corresponding associated devices 132. Such information can be used to automatically develop (e.g., by a representation engine corresponding to representation instructions 280) intuitive displays of system health that can easily and visually be interpreted by human operators, as well as electronic representations of common loops that are easily interpreted by other computing systems. Such information also can be used to programmatically optimize workload placement, as well as system maintenance.

The collection engine 110 can obtain data 112 from sensors/devices 140 located in multiple components of one or more cooling loop installations, to discover associated devices 132 sharing the same common loop 130. For example, a collection of flow sensor devices can be used by the collection engine 110 to monitor flow rate values for those sensors, to yield groups of sensors exhibiting similar readings and trends. The correlation engine 120 can use mathematical approaches to postulate a group of connected systems based on similar readings. The correlation engine 120 can iteratively postulate such group(s), and check the readings/groups against readings from other types of sensors/devices, such as inlet and outlet temperature and pressure sensor devices 140. If the postulated group conforms to available data, a deliberate perturbation of the system may be used to verify the grouping. For example, the correlation engine 120 (or a perturbation engine) can modulate the circulation pump of a CDU, to provide a change in flow patterns. Sensors within the postulated group can pick up such variations that match with the flow change. The perturbation can be a single pulse, or a combination of one or more different types of pulses. The perturbation can follow a pattern, such as increasing pump flow by several percent for a one minute period, then return to nominal flow, alternating flow rate in a square wave (or other) pattern. This perturbation pattern can be detected in other members of the postulated group, and a lack of detection in some devices is indicative of those devices being non-members (that do not share the common loop with those devices detecting the perturbation pattern). If inconsistencies are observed, the postulation can be iteratively adjusted/repeated and further observations made to verify the grouping.

It may be further possible to derive the flow order of racks within a common loop. For example, the correlation engine 120 can observe a series of effects propagating through a common loop, such as a sequence of changes in flow resistance, temperature drop, and/or other characteristic(s) (whether passively identified, or actively perturbed) passing from one device to the next. Identifying the propagation through the common loop allows the correlation engine 120 to infer the order of those devices within the common loop, beyond merely identifying which devices are members of the common loop.

Thus, unlike manual cooling loop analysis resulting from a static process (which may quickly become out-of-date as device configurations change and/or equipment faults occur), example implementations described herein enable automated systems, including those having periodic re-discovery/analysis, to enable dynamically updated knowledge of common cooling loop equipment/devices. Accordingly, such knowledge (e.g., in the form of a connection diagram or other representation of the knowledge) can be used to ensure that operational decisions are made with reliable and up-to-date data regarding how devices are cooled in a given installation, including redundancies in cooling loops to ensure robust support for workloads that can be deployed to avoid a single point of failure in a given cooling loop.

FIG. 2 is a block diagram of a system 200 to identify cooling loop characteristics, including collection instructions 210, correlation instructions 220, workload instructions 260, perturbation instructions 270, and representation instructions 280 according to an example. The various instructions can act on information/data associated with device(s) 240 associated with one or more cooling loops 250. The computer-readable media 204 is associated with a processor 202, which may execute the various instructions stored on the computer-readable media 204

Computer-readable media 204, which may serve as storage, is accessible by the system 200, to serve as a computer-readable repository to also store information such as data 112, inferences, connection diagrams, or other information that may be created by or otherwise referenced by the engines 110, 120 (or other engines) by execution of corresponding instructions 210, 220, etc. As described herein, the term "engine" may include electronic circuitry for implementing functionality consistent with disclosed examples. For example, engines 110, 120 represent combinations of hardware devices (e.g., processor and/or memory) and programming to implement the functionality consistent with disclosed implementations. In examples, the programming for the engines may be processor-executable instructions stored on a non-transitory machine-readable storage media, and the hardware for the engines may include a processing resource to execute those instructions. An example system (e.g., a computing device), such as system 100, may include and/or receive the tangible non-transitory computer-readable media storing the set of computer-readable instructions. As used herein, the processor/processing resource may include one or a plurality of processors, such as in a parallel processing system, to execute the processor-executable instructions. The memory can include memory addressable by the processor for execution of computer-readable instructions. The computer-readable media can include volatile and/or non-volatile memory such as a random access memory ("RAM"), magnetic memory such as a hard disk, floppy disk, and/or tape memory, a solid state drive ("SSD"), flash memory, phase change memory, and so on.

In some examples, the functionality of engines 110, 120, etc. may correspond to operations performed in response to, e.g., information from computer-readable media 204 and/or data 112 as received from or sent to the devices. The computer-readable storage media 204 may be accessible by the system 100, to store items in a format that may be accessible by the engines 110, 120, etc. Although not specifically shown in FIG. 1, the workload instructions 260 may correspond to a workload engine that may be included in the system 100 of FIG. 1. Similarly, the perturbation instructions 270 and the representation instructions 280 may correspond, respectively, to a perturbation engine and a representation engine in the system 100 of FIG. 1. Thus, in some examples, operations performed when instructions 210-280 are executed by processor 202 may correspond to the functionality of engines 110, 120 (and the other corresponding engines as set forth above, not specifically illustrated in FIG. 1).

As set forth above with respect to FIG. 1, engines 110, 120, etc. may include combinations of hardware and programming. Such components may be implemented in a number of fashions. For example, the programming may be processor-executable instructions stored on tangible, non-transitory computer-readable media 204 and the hardware may include processor 202 for executing those instructions 210, 220, etc. Processor 202 may, for example, include one or multiple processors. Such multiple processors may be integrated in a single device or distributed across devices. Media 204 may store program instructions, that when executed by processor 202, implement system 100 of FIG. 1, including those engines corresponding to instructions 210-280. Media 204 may be integrated in the same device as processor 202, or it may be separate and accessible to that device and processor 202.

In some examples, program instructions can be part of an installation package that when installed can be executed by processor 202 to implement system 100. In this case, media 204 may be a portable media such as a CD, DVD, flash drive, or a memory maintained by a server from which the installation package can be downloaded and installed. In another example, the program instructions may be part of an application or applications already installed. Here, media 204 can include integrated memory such as a hard drive, solid state drive, or the like. While in FIG. 2, media 204 includes instructions 210-280, one or more instructions may be located remotely from media 204. Conversely, information/data may be included with media 204, such as data collected from devices, inferences formed by the correlation engine, perturbation patterns, and so on.

The computer-readable media 204 may provide volatile storage, e.g., random access memory for execution of instructions. The computer-readable media 204 also may provide non-volatile storage, e.g., hard disk or solid state disk for storage. Components of FIG. 2 may be stored in any type of computer-readable media, whether volatile or non-volatile. Content stored on media 204 may include images, text, executable files, scripts, or other content that may be used by examples as set forth below. For example, media 204 may contain collected data, a connection diagram, or other information used by and/or produced by the engines and/or instructions 210-280.

The workload instructions 260 may be executed (e.g., by a workload engine) to distribute workloads to computing system devices in view of identified common loops. For example, a workload may be divided among computing system devices spread across multiple different common loops. This way, if an issue or failure of one common loop develops, the workload can continue executing on those computing system devices of other common loops. In other words, a system can avoid creating a single point of failure, by avoiding putting a workload on devices that all share a common loop.

The perturbation instructions 270 may be executed (e.g. by a perturbation engine or correlation engine 120), to perturb characteristics of a cooling loop and/or device among the cooling loops. Such a perturbation may be detected at other devices, to allow the correlation engine 120 to infer which devices 140 are a member of a given common loop 130. The perturbation instructions 270 can ensure that a given workload or device/equipment will not be negatively affected or damaged. A perturbation, as used herein, is a type of excursion/variation of a characteristic of a device, which affects that device's associated cooling loop. For example, a perturbation engine can use flow rate as a type of non-detrimental perturbation, and/or coolant perturbed to a lower supply temperature, and/or adjustments to coolant chemical characteristics, such perturbations being detectable without affecting workloads that might be running on equipment associated with perturbed cooling loops. For example, the perturbation instructions 270 can instruct an injection device (which can reside anywhere in a cooling loop, such as at a CDU) to inject a chemical buffer solution (e.g., to adjust pH of the coolant), a chemical which is not an active participant in temperature control to avoid negatively affecting temperatures, into its corresponding cooling loop. Correlation instructions 220 can then identify corresponding detections of chemical characteristic changes in other chemical sensors at other devices, such as other CDUs, computing system racks, and/or standalone sensors, which share a common loop with the injecting CDU. The perturbation in chemical characteristics can then be corrected by injecting an appropriate type of chemical to restore the original/desired pH to the coolant. In another example, the perturbation instructions 270 can instruct a CDU to aerate its cooling loop. Other CDUs will then respond by removing the perturbed/added air using a vacuum pump, whose activation is identifiable as data by the collection instructions 210, and correlated by correlation instructions 220 to identify a common loop. Such benign perturbations to cooling loop can ensure that devices/equipment relying on such cooling loops will not be disturbed or otherwise affected in a way that would cause a negative impact to any running workloads. In some examples, such as perturbing temperature or coolant flow, the corresponding devices/equipment operation can be enhanced due to increased cooling performance during the perturbation (increased flow, reduced coolant temperature).

The perturbation instructions 270 can generate perturbation patterns, by instructing devices to generate adjustment/transitions in a detectable manner. A characteristic, such as temperature, flow, etc., can be modulated/cycled/pulsed over time, to cause a detectable pattern. Such pulsing/dynamic adjustments can extend over long periods of time. For example, pH perturbations can be made over periods of hours or days, because such benign adjustments are free to run on systems without risk of disturbing any workloads/devices. Examples described herein enable the perturbation engine/instructions 270 to apply perturbations, manually or automatically, without a need to take systems offline.

The perturbation pattern can be based on modulation according to various suitable shapes. The modulation can also be adaptive, by trying a first pattern and checking for detection, then changing to a second pattern, and so on. In some examples, the perturbation engine/instructions 270 can use a square wave pulsing perturbation pattern, then try a sine wave, a triangular wave, or a series/combination of differently-shaped pulses over time. Accordingly, the perturbation engine/instructions 270 can create a perturbation pattern that is fully detectable, to rule-out any random variations that might occur (e.g., temperature may vary as a result of natural workload changes over time, but a specifically detected perturbation pattern of temperature changes can be distinct from such work-related temperature drifts).

The collection engine/instructions 210 and correlation engine/instructions 220 can gather and identify information from many different types of sensors/devices, whether the information is naturally occurring during normal operations/downtime, or during periods of perturbation. For example, during normal operation, the correlation engine/instructions 220 can check for correlations between a given gathered signal and other signal(s), e.g., via a pairwise comparison, repeating for any number of pairings among the group of available sensors/devices. After forming those inferences or checks for correlations during a passive survey/monitoring of the sensors/devices, the system can proceed to generate a perturbation signal at a given one or more of the sensors/devices. The correlation engine/instructions 220 can then check whether the already-generated inferences/correlations are consistent with gathered information/inferences formed as a result from data arising during the perturbations. For example, passive monitoring may result in initially identifying a tentative correlation between three given temperature sensors, but during perturbation, perhaps only two of the three temperature sensors reflects the perturbation and so the tentative correlation is revised to include those two sensors. This can be repeated using different perturbation patterns or types of perturbation (temperature, flow, pressure, aeration, chemical characteristics, and so on). The various engines/instructions enable such example robust approaches to be used to intelligently identify correlations and isolate them from coincidence/drift/normal operations, resulting in positive identification of common loops between various sensors/devices, done automatically without a need for operator labor/intervention or disturbance of active devices or their workloads.

The representation instructions 280 may be executed (e.g. by a representation engine) to build a connection diagram representing devices that share the common loop. For example, a representation engine can build a connection diagram as illustrated in FIG. 3 (from the perspective of the common loops) and FIG. 4 (from the perspective of the workload). Connection diagrams can be created from source data and inferences, as gathered and formed by the collection engine 110 and correlation engine 120, and represented in various formats from different perspectives, in terms of what would be useful for a given situation. For example, a connection diagram can be prepared for use by an operator, with a visually intuitive layout. In alternate examples, a connection diagram can be prepared for use by other computing systems, based on textual/numerical data, without a need for visually intuitive layouts.

FIG. 3 is a block diagram of a system 300 including a plurality of cooling loops, including common loop 1 351, common loop 2 352, and common loop 3 353 according to an example. The common loop 1 351 includes CDU1 342, rack1 341, and rack2 343, having a cooling loop flowing to each of those devices. Accordingly, if a pump in CDU1 342 fails, coolant will not be pumped through common loop 1 351, affecting rack2 343. The common loop 2 352 includes CDU2 344, rack1 341, and rack3 345. Because common loop 2 352 also flows through rack1 341, it can provide coolant to rack1 341 even if common loop 1 351 fails. The common loop 3 353 includes CDU3 346, rack4 347, and sensors 348. System 300 is shown as one illustrative example, and many variations are possible (e.g., having sensors 348 spread among other loops, having more of the CDUs/racks arranged to redundantly share multiple cooling loops, etc.). The arrangement of system 300 in FIG. 3 might be typical of a system that previously was built out having rack2 343 redundantly share common loop 3 353, and having rack3 345 redundantly share common loop 3 353. However, such an initial arrangement of system 300 may have evolved into the illustrated (perhaps non-optimal) arrangement over time, as various modifications, upgrades, and/or repairs are performed to the system 300.

The example implementations described herein can automatically identify the layout of the common loops among the various devices, and provide an easily understood visual representation to enable the system to be monitored and/or optimized. System 300 can involve complex interconnections and dependencies for the various servers/devices and/or workloads deployed on the system 300. A cooling loop can be a source of issues, affecting its associated devices if the loop suffers an issue such as a leak, clog, pump failure, or other problem. A connection diagram, such as those illustrated in FIGS. 3 and 4, can be automatically generated by example implementations, helping an operator or other system to determine what parts of a system may be at risk (e.g., whether a given device enjoys cooling loop redundancy), and whether to prioritize workload deployment to one system or the other according to common loop arrangements/redundancies. For example, a workload engine/instructions may bias workload distribution away from devices in common loop 3 353 (due to lack of cooling loop redundancy), and toward devices in rack1 341 (due to the redundancy of being serviced by common loops 1 351 and 2 352). The workload engine/instructions can manage workloads as they are newly assigned (e.g., after completion of an existing workload), and/or dynamically during execution of a workload. The connection diagram can be visual as shown in FIGS. 3 and 4 (e.g., for easy/intuitive operator engagement), or logical/numerical/coded for communication to other systems (e.g., based on a table, text file, raw data, or other forms of information communication).

In another example (not shown), four racks can be arranged in a 2N configuration, meaning four racks and two CDUs, to enable two times the capacity that is needed for the given assets. If one of the CDUs fails, then the system operates as 1N, to meet capacity of the system. Referring to FIG. 3, rack1 341 is served by CDU1 342 and CDU2 344, resulting in twice the capacity or 2N for rack1 341. The other example 2N system can operate the redundant CDUs in various manners, e.g., each carrying 50% of the load. The CDUs are in communication/coordination with each other, e.g., in a master-slave configuration. A correlation engine can also communicate with the CDUs and coordinate their redundant operation. If one of the CDUs fails, the other CDU can pick up the load to provide 100%. Alternatively, one CDU can normally operate at 100% of the load, with the other serving as a reserve backup and sitting idle at 0% until needed (if the first CDU fails).

Accordingly, the correlation engine can identify valuable information in identifying the dependencies/relationships between the various devices such as racks and CDUs, to know which devices are being influenced by and/or isolated from a given CDU/cooling loop. Such information can be inferred as set forth above regarding the various engines/instructions, via passive observation and/or perturbation.

FIG. 4 is a connection diagram 400 from the perspective of a workload 306, including common loop 1 351, common loop 2 352, and common loop 3 353 according to an example. The connection diagram 400 is shown as a Boolean chart, where "AND" and "OR" symbols are used to represent dependencies. As shown, rack1 341 is redundantly dependent on either common loop 1 351 (which depends on CDU1 342), OR common loop 2 352 (which depends on CDU2 344). Rack4 347 is solely dependent on the single common loop 3 353 (which depends on CDU3 346). This Boolean chart corresponds to the map layout chart of FIG. 3, where common loops 1 351 and 2 352 both redundantly service rack1 341. Thus, the workload 306 will be executed by rack1 341 and rack4 347, and enjoys triple redundancy among CDU1 342, CDU2 344, and CDU3 346.

The connection diagrams 300, 400 shown in FIGS. 3 and 4 are merely examples, and other arrangements are possible. For example, rather than showing the connection diagram 400 from the perspective of the workload 306 (that displays dependencies needed to provide cooling service to the workload 306), the connection diagram 400 could be shown from the perspective of a given rack, common loop, CDU, or other device/loop. Such a connection diagram can easily show, for example, which devices would be affected if a rack failed, or if a loop failed, etc. Data collected and correlated by the various engines can be arranged by a representation engine/instructions in whatever format is desirable for representing a given piece of information. A system can use such information to identify whether to operate the system in a degraded state (e.g., whereby the system is no longer operating with redundancies).

Connection diagrams 300, 400 also can represent system information useful for operations planning, maintenance scheduling, uptime calculation, energy efficiency metrics, optimization, and the like. Visual display formats may include icons, bar charts, Venn diagrams, tables, strip chart recorders, and the like. The various instructions/engines set forth above can automatically determine such diagrams/fault trees, without a need for manual effort. The connection diagrams 300, 400 can be dynamically updated. Equipment information gathered through implementations set forth herein can be made available by a representation engine in diagram form, allowing an operator to quickly understand cooling loop configurations. The cooling loop information can be integrated with status information and information about other sub-systems, to provide useful information to operators.

Additionally, connection diagrams can be generated in non-visual formats, for use by other computers/equipment. Examples include numerical representations such as a linked-list or other computer-readable or logically interpretable format. The representation engine can also provide a scripting interface/provision, in addition to and/or as an interactive element of connection diagrams. The scripting provision enables the connection diagram/fault tree information to be available programmatically, e.g., for use by management software, workload placement instructions/engines, risk mitigation routines, and so on.

A workload engine/instructions can use the connection diagrams/scripting provision to assign workloads to devices/machines. For example, the workload engine can deploy a workload to a physical machine having a highest number of redundant systems operating in an uncompromised state. Thus, the hardware with the least potential for failure can be chosen with the highest priority, dynamically as workloads are assigned and devices are occupied. In some alternate examples, the workload engine can deploy workloads according to the most available (or efficient) cooling loop, the most powered, or the most networked domain, to achieve relative domain load balancing.

The instructions/engines of implementations described herein also can notify task schedulers of risks to availability when a fault is identified in a domain/cooling loop. Common loops, and/or their associated devices, can be assigned a health metric corresponding to potential for failure of that loop. Loops can be proactively controlled to move jobs into a physical area of the data center in order to most efficiently and/or redundantly utilize cooling resources when a lower-than-maximum number of nodes/devices is needed. In some implementations, the workload engine can shut down a section of the data center in order to move workloads to an area of the data center where power and cooling will run at maximum efficiency in a smaller area of the system of devices.

Thus, the output of the example systems described herein can provide various benefits. Output can be automated, to provide results with little manual effort. System uptime, maintenance, and resource management is optimized, including the ability to provide predictive maintenance scheduling according to which devices share a given common loop (e.g., providing less-frequent servicing to devices on seldom-used cooling loops). Data center workload placement options can be evaluated for risk, and jobs can be scheduled based on current operational status of cooling loop hardware. Approaches can be integrated into other datacenter management offerings, to provide enhanced customer value. A notification engine can provide proactive maintenance notifications for subsystems considered to be at risk (e.g., lacking redundancy or operating excessively), before faults have a chance to result in loss of availability. Data center efficiency can be improved by moving workloads (virtual machines (VMs) or jobs) to more efficient and more reliable physical areas of a data center, e.g., at night or to shed lower priority processing when electricity costs are highest.

FIG. 5 is a chart 500 showing readings 501, 502, 503, 504 from a plurality of sensors/devices, including correlations 507, events 508, and trends 509 according to an example. The readings 501-504 may represent readings from one type of sensor for a plurality of devices in one or more common loops, and may also represent readings from different types of sensors and/or devices (e.g., two pressure sensors, two flow sensors).

The illustrated sensor reading data can be passively derived, e.g., during normal operation of devices in a given system. For example, the third and fourth sensor readings 503, 504 correlate well with each other, and can represent an increase in temperature of a common loop from time 75 minutes to 240 minutes. The first and second sensor readings 501, 502 can also represent temperature, but do not correlate well with the third and fourth sensor readings 503, 504 and may correspond to one or more different cooling loops that are not in common with the loop shared by the third and fourth sensor readings 503, 504.

A collection engine can collect the data for the sensor/device readings 501-504, and a correlation engine can infer (based on the collected data) which devices share common loops. The illustrated data was obtained by passively monitoring, and approaches can also iteratively use perturbations to actively perturb the system and look for perturbation patterns (not shown in FIG. 5) to show up among the readings 501-504. The correlation engine can use conventional mathematical functions/analyses to correlate the collected data, such as by determining a correlation coefficient for the data. Although the correlation 507 suggests that readings 502-504 are correlated (e.g., relatively flat at the same time, despite the spike in reading 501 during that time), the other events 508 suggest that the correlation 507 should be revised to exclude the second reading 502.

The correlation engine can infer which systems are part of a common loop, e.g., by looking for similar anomalies (such as events 508 and/or trends 509) in sensor readings, including spikes in temperature, flow, or other detectable characteristics of cooling loops. Such anomalies can manifest on their own during system use, and also during deliberately introduced perturbations that can be read by devices/sensors. The propagation of the perturbation can be tracked from device to device over time, allow determination of connected plumbing and even the attachment sequence of plumbing along a given cooling loop. Mathematical correlation analysis may be applied to build the correlation among the devices based on temporal changes of the collected readings/metrics. Similar disturbances or correlation analysis may enable mapping of air cooling domains within systems, or even in the data center facility as a whole, such that results are not limited to liquid cooling loops.

The sensor data of FIG. 5 shows readings from four devices/sensors. Readings 501 and 502 show several strong visual similarities, leading to the inference that readings 501 and 502 correspond to similar data from different parts of the same cooling loop. This inference can further be tested by perturbing the system iteratively until a perturbation shows up in either one or both of the first and second readings 501, 502. If a perturbation shows up in both over a similar timeframe, the correlation engine can infer that the first and second readings 501, 502 correspond to a common loop. If the perturbation shows in one of the two, then the correlation engine can conclude that the first and second readings 501, 502 do not correspond to a common loop.

The events 508 highlight areas of similar data trends in the third and fourth readings 503, 504. Comparison to the first and second readings 501, 502 does not reveal a good correlation, supporting the inference that the first and second readings 501, 502 do not form part of the same cooling loop as the third and fourth sensor readings 503, 504.

Mathematical correlation can be performed via various approaches to determine correlations between a plurality of readings. The correlation coefficient of readings 501 and 502 over the entire dataset (e.g., as manually calculated using a spreadsheet function for correlation coefficient) was 0.8, indicating a strong match (where a correlation coefficient of 1.0 indicates a mathematically perfect match). The correlation engine can perform pairwise comparisons to identify correlation coefficients for other pairs of readings. For example, comparing reading 501 to readings 503 and 504 results in a much lower correlation coefficient, indicating a weaker correlation. The correlation engine may use a threshold value to compare against and identify whether a given correlation coefficient corresponds to a match, or is within range of the threshold to merit further iterative explorations/perturbations. In other examples, the correlation engine can identify a rolling correlation of the "n" most recent readings, whereby a rolling window of data (such as an array of data) is populated by the n (e.g., 15 or 20) most recent data points, confining the correlation to be applied to that window. The size of n (i.e., the window) can be adjusted to correspond to the rate at which data is collected, taken in view of how quickly the data is expected to change. For example, when perturbing temperature, the perturbation may show up relatively quickly over minutes, and the window can be adjusted to capture the perturbation accordingly. However, if perturbing chemical characteristics of a cooling loop, such as pH, the perturbation may span hours, and the window can be adjusted accordingly (by increasing n to cover a wider span of time, and/or by decreasing the data collection rate to cover a wider span of time). In other examples, the correlation engine can use event detection approaches to identify areas of significant signal change for a given reading, such as those illustrated within the ovals of events 508. Similarly, the correlation engine can identify areas of trends, such as the upward trend 509 leading to the culmination in an event 508. Accordingly, it is possible for the correlation engine to act upon a single reading, finding trends and events within that reading individually, independent of whether that reading correlates with other readings.

Correlated events 508 can be identified by relatively similarly timed changes among multiple readings. There can be some sequence/delay between readings in a given events, which may correspond to different positions of sensors/devices along a given cooling loop, and the speed of coolant circulation in that loop. Such delays can also be used by the correlation engine to infer where an event/change/perturbation originated, and to where the event propagated. For example, the correlation engine can identify a delay between readings that is still deemed to be an event, when the delay is reproducible (e.g., based on a time delay, or the cooling loop volume flow, etc.), even if not simultaneous among readings.

The correlation engine can compare readings to previously collected data, or to a window of n most recent data collections, to compare and correlate data. The correlation engine can thereby identify a trend in one or more readings, and make predictions regarding next readings/data. If the prediction is significantly wrong (i.e., deviates from a trend established from past data), the correlation engine can identify that deviation from past trends as the start of a new trend and/or defining a new event. In an example, a chemical characteristic sensor can identify levels of pH, corrosion inhibitor, and two different biocides in a liquid cooling loop. The sensor can measure impedance of the coolant, which changes as a function of chemical characteristics, and performs a frequency spectrum sweep to identify the different chemicals using their corresponding different frequencies. A combination of those multiple different types of readings can be used to determine an event pertaining to chemical characteristics of the cooling loop, e.g., when one or more features changes in an unpredicted way. Furthermore, a chemical characteristic such as pH can be manually perturbed up or down as desired, such that the pH can be adjusted in either direction, and allowed to remain perturbed for an arbitrary amount of time until being perturbed back to baseline values. An additional benefit of perturbing chemical characteristics is that workloads will not be affected, and can continue running regardless of whether chemical perturbations are being applied. Similarly, flow rate can be increased, temperature can be decreased, and other such perturbations can be applied without impacting the workloads, and in some cases, benefitting the performance (e.g., at the cost of increased power consumption to provide enhanced cooling as a perturbation).

In an example, the correlation engine can analyze readings from different types of sensors in order to identify a correlation indicative of a shared common loop. For example, the correlation engine can correlate output from a flow sensor and a pressure sensor, or a temperature sensor and a pressure sensor. Although not perfectly linear, the correlation engine can detect a noticeable effect on, e.g., an imaginary impedance of the cooling loop. Furthermore, the correlation engine can use parameters from a sensor that are not normally directly used for sensing. For example, a sensor may measure two characteristics, but the second characteristic is not typically used as a reading because the sensor itself will use the second characteristic to calibrate/correct the first characteristic. Example implementations described herein can access the raw data from both sensor characteristics, and use those raw sensor numbers to identify correlations, essentially obtaining an additional second sensor reading from a given sensor. Similarly, sensor readings can be used to normalize or otherwise adjust for natural drifts or shifts (e.g., temperature changes due to workload changes) that might otherwise alter readings from other sensors (causing the chemical sensor to drift along with the temperature change), to isolate the usable data from sensor readings in order to identify, e.g., trends/events/correlations.

To introduce a perturbation, a given system may use various techniques. For example, a CDU can inject chemicals into its cooling loop to perturb chemical composition that can be detected by chemical sensors. A system can use a heater at the flow manifolds of a rack to create a perturbation in the coolant return temperature that can be detected by temperature sensors. Other techniques of introducing controllable perturbations are possible, consistent with the types of devices/sensors available for detecting that perturbation.

In some examples, temperature perturbations can be observed and even introduced based on varying workloads. An example of data arising from naturally varying temperatures can be seen in readings 503 and 504 in the example data of FIG. 5, arising from changes in workload that caused increased CPU activity and raised the coolant temperature. Thus, as used herein, varying temperatures includes those variations arising due to varying workloads (such as a change in a given workload intensity, and/or a change in distribution of workloads), whether passively observed and/or actively perturbed. Such temperature variations are not limited to CPU activity, but can affect temperatures via any form of information technology workload. In an example implementation, varying a workload characteristic can be used as a diagnostic tool when a system is not running a production job or other critical/priority job, to controllably perturb temperatures of the cooling loop(s). The metric of the workload is therefore correlatable by the correlation engine, and can be spread across multiple coolant loops without needing to be limited to a given cooling loop. In an example, a correlation engine can obtain the workload metric for a given device, server, and/or rack, including obtaining such data from data center management software such as integrated Lights-Out (iLO), an out-of-band management tool. Workload also can be inferred based on power monitoring of power subsystems at the rack level, to identify the total amount of power being expended in a rack, to help isolate trends/events/correlations among the different racks and whether they share a loop.

Thus, many different characteristics are available for passively monitoring and/or actively perturbing, in order to collect data used to infer common loops among systems. The availability of multiple characteristics also allows great flexibility in enabling a given implementation to achieve perturbed characteristics, without impacting workload. For example, a sensitive workload may prevent the cooling loop from being perturbed to an increased temperature. In view of such a constraint, another characteristic such as chemistry or flow rate/pressure can be perturbed, enabling valuable data collection and automatic inference of the common loops.

Referring to FIGS. 6 and 7, flow diagrams are illustrated in accordance with various examples of the present disclosure. The flow diagrams represent processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 6 is a flow chart 600 based on identifying a common loop according to an example. In block 610, a perturbation engine is to perturb at least one characteristic of at least one of a plurality of cooling loops associated with a plurality of devices. For example, the perturbation engine can instruct a device (CDU pump) to increase coolant flow at that device, thereby affecting the coolant flow of the cooling loop associated with that device. In block 620, a collection engine is to collect data from at least a portion of the plurality of devices associated with the plurality of cooling loops. For example, the collection engine can collect flow rate information as identified by other CDUs, and/or by other flow sensors distributed throughout a system. In block 630, a correlation engine is to correlate the data collected to identify a common loop from among the plurality of cooling loops, and which of the plurality of devices are associated with the common loop. For example, the correlation engine can identify a trend, an event, or a correlation coefficient between collected data exceeding a threshold, and deem that two or more readings are correlated. The correlation engine can then iteratively test such inferences, by selectively perturbing various characteristics and revising inferences accordingly.

FIG. 7 is a flow chart 700 based on deploying a workload and generating a prediction and/or task according to an example. In block 710, a common loop is identified from among a plurality of cooling loops, and which of the plurality of devices are associated with the common loop. For example, a correlation engine can identify correlations exceeding a threshold, and iteratively perturb various characteristics of a system to refine the inferences regarding the correlations, to identify common loops. In block 720, a workload engine is to deploy a workload among at least a portion of the plurality of devices sharing an identified plurality of common circulation loops, to reduce a potential for failure due an issue with a given cooling loop. For example, a workload can be distributed among a first rack from a first common loop, and a second rack from a second common loop, to avoid deploying the entire workload onto devices sharing a single common loop, such that failure of either common loop used will allow the workload to continue on the remaining loop. Similarly, workloads can be deployed onto a device that is serviced redundantly by multiple common loops, such as rack1 341 shown in FIG. 3. In block 730, at least one of i) a maintenance prediction, and ii) a scheduled task, is generated for at least one device associated with the at least one common loop. For example, a workload engine can identify that a common loop involves three devices that experience high coolant flow/temperature fluctuations, and thereby increase a rate of servicing requests to perform maintenance on those devices involved in that loop. The workload engine also can identify that tasks have been assigned to some common loops but not others, and send workloads to devices sharing idle cooling loops.

Examples provided herein may be implemented in hardware, software, or a combination of both. Example systems can include a processor and memory resources for executing instructions stored in a tangible non-transitory medium (e.g., volatile memory, non-volatile memory, and/or computer readable media). Non-transitory computer-readable medium can be tangible and have computer-readable instructions stored thereon that are executable by a processor to implement examples according to the present disclosure.

An example system (e.g., including a controller and/or processor of a computing device) can include and/or receive a tangible non-transitory computer-readable medium storing a set of computer-readable instructions (e.g., software, firmware, etc.) to execute the methods described above and below in the claims. For example, a system can execute instructions to direct a correlation engine to identify correlations in cooling loop data, wherein the engine(s) include any combination of hardware and/or software to execute the instructions described herein. As used herein, the processor can include one or a plurality of processors such as in a parallel processing system. The memory can include memory addressable by the processor for execution of computer readable instructions. The computer readable medium can include volatile and/or non-volatile memory such as a random access memory ("RAM"), magnetic memory such as a hard disk, floppy disk, and/or tape memory, a solid state drive ("SSD"), flash memory, phase change memory, and so on.

What is claimed is:

1. A system to identify cooling loop characteristics, comprising:
 a collection engine to collect data from a plurality of devices associated with a plurality of cooling loops; and
 a correlation engine to identify, based on the data collected, a common loop from among the plurality of cooling loops, and which of the plurality of devices are associated with the common loop.

2. The system of claim 1, further comprising a workload engine to deploy a workload among at least a portion of the plurality of devices to include at least one device in a first common loop and at least one device in a second common loop, to mitigate risk of workload failure due to an issue with a given common loop.

3. The system of claim 1, further comprising a perturbation engine to cause at least one of the plurality of devices to perturb at least one characteristic of at least one of the plurality of cooling loops, such that a perturbation of at least one of the plurality of devices is identifiable by the correlation engine.

4. The system of claim 3, wherein the perturbing is based on modulating the at least one characteristic according to a perturbation pattern that periodically varies over time, such that the perturbation pattern is identifiable by the correlation engine.

5. The system of claim 3, wherein the at least one characteristic includes at least one of i) flow, ii) temperature, iii) pressure, and iv) chemical characteristics of coolant.

6. The system of claim 3, wherein the perturbation engine is to cause a coolant distribution unit (CDU) device to vary a pump rate periodically over time to perturb a flow of coolant of a cooling loop associated with the CDU.

7. The system of claim 1, further comprising a representation engine to build a connection diagram representing devices that share the common loop.

8. The system of claim 1, wherein the correlation engine is to identify the common loop being fluidically coupled with devices including at least one of i) a CDU device, and ii) a computing system rack device.

9. The system of claim 1, wherein the plurality of devices include at least one type of sensor chosen from among the types including i) a flow sensor, ii) a temperature sensor, iii) a pressure sensor, and iv) a chemical sensor.

10. The system of claim 9, wherein the correlation engine is to identify the common loop based on correlating first data, from a first type of sensor, with second data from a second type of sensor that is a different type of sensor than the first type of sensor.

11. A method to identify cooling loop characteristics, comprising:
 perturbing, by a perturbation engine, at least one characteristic of at least one of a plurality of cooling loops associated with a plurality of devices;
 collecting, by a collection engine, data from at least a portion of the plurality of devices associated with the plurality of cooling loops; and
 correlating, by a correlation engine, the data collected to identify a common loop from among the plurality of cooling loops, and which of the plurality of devices are associated with the common loop.

12. The method of claim 11, further comprising deploying, by a workload engine, a workload among at least a portion of the plurality of devices sharing an identified plurality of common circulation loops, to reduce a potential for failure due an issue with a given cooling loop.

13. The method of claim 11, further comprising generating at least one of i) a maintenance prediction, and ii) a scheduled task, for at least one device associated with the at least one common loop.

14. A non-transitory machine-readable storage medium encoded with instructions to identify cooling loop characteristics, executable by a computing system that, when executed, cause the computing system to:
   collect data from a plurality of devices associated with a plurality of cooling loops;
   identify, based on the data collected, a common loop from among the plurality of cooling loops, and which of the plurality of devices are associated with the common loop; and
   deploy a workload among at least a portion of the plurality of devices to include at least one device in a first common loop and at least one device in a second common loop, to mitigate risk of workload failure due to an issue with a given one of the first and second common loops.

15. The storage medium of claim 14, further comprising instructions that cause the computing system to provide a notification of a risk to availability in response to identification of an issue with the given one of the first and second common loops.

* * * * *